United States Patent
Pfeiffer et al.

(10) Patent No.: US 7,858,967 B2
(45) Date of Patent: Dec. 28, 2010

(54) DOPED SEMICONDUCTOR MATERIAL AND PROCESS FOR PRODUCTION THEREOF

(75) Inventors: Martin Pfeiffer, Dresden (DE); Leo Karl, Dresden (DE); Ansgar Werner, Dresden (DE); Torsten Fritz, Dresden (DE)

(73) Assignee: Novaled AG, Dresden (DE)

( * ) Notice: Subject to any disclaimer, the term of this patent is extended or adjusted under 35 U.S.C. 154(b) by 239 days.

(21) Appl. No.: 10/489,131

(22) PCT Filed: Feb. 20, 2003

(86) PCT No.: PCT/DE03/00558

§ 371 (c)(1),
(2), (4) Date: Oct. 12, 2004

(87) PCT Pub. No.: WO03/070822

PCT Pub. Date: Aug. 28, 2003

(65) Prior Publication Data

US 2005/0040390 A1 Feb. 24, 2005

(30) Foreign Application Priority Data

Feb. 20, 2002 (DE) ................. 102 07 859

(51) Int. Cl.
*H01L 35/24* (2006.01)
*H01L 51/00* (2006.01)

(52) U.S. Cl. ................. 257/40; 257/E51.001
(58) Field of Classification Search ........... 257/40, 257/E51.001
See application file for complete search history.

(56) References Cited

U.S. PATENT DOCUMENTS

| 5,093,698 | A | * | 3/1992 | Egusa | 257/40 |
| 5,674,597 | A | * | 10/1997 | Fujii et al. | 428/212 |
| 5,811,833 | A | * | 9/1998 | Thompson | 257/40 |
| 5,882,829 | A | * | 3/1999 | Hsieh et al. | 430/58.15 |
| 5,922,396 | A | * | 7/1999 | Thompson | 427/69 |
| 6,013,384 | A | * | 1/2000 | Kido et al. | 428/690 |
| 6,447,934 | B1 | * | 9/2002 | Suzuki et al. | 428/690 |
| 2002/0017612 | A1 | * | 2/2002 | Yu et al. | 250/370.11 |

FOREIGN PATENT DOCUMENTS

| GB | 2356738 | 5/2001 |
| JP | 57-18757 | 1/1982 |
| JP | 3-222477 | 10/1991 |
| JP | 2001527688 | 12/2001 |
| JP | 200225780 | 1/2002 |

OTHER PUBLICATIONS

Merriam-Webster Online Dictionary—definition of cation.*
Merriam-Webster Online Dictionary—definition of anion.*
Nakada et al., A Design of Multiplexing Liquid-Crystal Display for Calculators, IEEE Transactions on Electron Devices, vol. Ed-22, No. 9, Sep. 1975, pp. 725-729.

* cited by examiner

*Primary Examiner*—Eugene Lee
*Assistant Examiner*—Anthony Ho
(74) *Attorney, Agent, or Firm*—Sutherland, Asbill & Brennan. LLC

(57) ABSTRACT

The invention relates to a doped organic semiconductor material with increased charge carrier density and more effective charge carrier mobility, which may be obtained by doping an organic semiconductor material with a chemical compound comprising one or several organic molecular groups (A) and at least one further compound partner (B). The desired doping effect is achieved after cleavage of at least one organic molecular group (A) from the chemical compound by means of at least one organic molecular group (A) or by means of the product of a reaction of at least one molecular group (A) with another atom or molecule.

20 Claims, No Drawings

DOPED SEMICONDUCTOR MATERIAL AND PROCESS FOR PRODUCTION THEREOF

The invention relates to doped organic semiconductor material having enhanced charge carrier density and effective charge carrier mobility according to the claims, a process for production of the doped organic semiconductor material, and use of the semiconductor material.

Since the demonstration of organic light-emitting diodes and solar cells in 1989 [C. W. Tang et al., *Appl. Phys. Lett.* 51 (1987, no. 12), 913], components made up of organic thin layers have been the subject of intensive research. Such layers possess advantageous properties for the applications mentioned, as for example efficient electroluminescence for organic light-emitting diodes, high absorption coefficients in the range of visible light for organic solar cells, economical production of materials and fabrication of components for very simple electronic circuits, et alia. Commercial significance has already been attained by the use of organic light-emitting diodes in display applications.

The performance features of (opto-)electronic multilayer components are determined among other things by the ability of the layers to transport the charge carriers. In the case of light-emitting diodes the ohmic losses in the charge transport layers are related in operation to the conductivity, which firstly influences the necessary operating voltage directly, and secondly determines the heat loading of the component as well. Furthermore, depending on the charge carrier concentration of the organic layers, there will be a band deflection in the neighborhood of a metal contact, facilitating the injection of charge carriers and hence capable of reducing the contact resistance. Similar considerations lead to the conclusion, for organic solar cells as well, that their efficiency is also determined by the transport properties of charge carriers.

By doping hole transport layers with a suitable acceptor material (p-dope) and/or electron transport layers with a donor material (n-dope), the charge carrier density in organic solids (and hence the conductivity) can be enhanced considerably. Furthermore, in analogy to experience with organic semiconductors, applications are to be expected that depend precisely on the use of p- and n-doped layers in a component, and would not be conceivable otherwise. U.S. Pat. No. 5,093,698 describes the use of doped charge carrier transport layers (p-doping of the hole transport layer by admixture of acceptor-like molecules, n-doping of the electron transport layer by admixture of donor-like molecules) in organic light-emitting diodes.

The following approaches are so far known for improving the conductivity of organic vapor-deposited layers:

1 Enhancement of charge carrier mobility by
  (a) Use of electron transport layers consisting of organic radicals (U.S. Pat. No. 5,811,833)
  (b) Production of high-order layers permitting an optimal overlap of the pi-orbitals of the molecules
2 Enhancement of density of moving charge carriers by
  (a) Cleaning and conservative treatment of materials to avoid the formation of charge carrier sticking points
  (b) Doping of organic layers with
    aa) Inorganic materials (gases, alkali metal atoms, U.S. Pat. No. 6,013,384 (J. Kido et al.); J. Kido et al., *Appl. Phys. Lett.* 73 (1998), 2866)
    bb) Organic materials (TNCQ (M. Maitrot et al., *J. Appl. Phys.* 60 (1986, no. 7), 2396-2400); F4TCNQ (M. Pfeiffer et al., *Appl. Phys. Lett.* 73 (1998, no. 22), 3202); BEDT-TTF (A. Nollau et al., *J. Appl. Phys.* 87 (2000, no. 9), 4340)

Doped organic charge transport layers have been used successfully to improve organic light-emitting diodes. By doping the hole transport layer with the acceptor material F4TCNQ, a drastic reduction of the operating voltage of the light-emitting diode is achieved (X. Zhou et al., *Appl. Phys. Lett.* 78 (2001, no. 4), 410). A similar success is achieved by doping the electron transporting layer with Cs or Li (J. Kido et al., *Appl. Phys. Lett.* 73 (1998, no. 20), 2866; J.-S. Huang et al., *Appl. Phys. Lett.* 80 (2002), 139).

Electrical doping with inorganic materials suffers from the disadvantage that the atoms or molecules used, owing to their small size, may easily diffuse in the component, thus rendering more difficult a defined production e.g. of sharp transitions from p-doped to n-doped regions. Diffusion plays a subordinate role by comparison, using large organic molecules as donors. However, their use is limited by the circumstance that potential donor molecules must distinguish themselves by extreme values of electronic affinity for p-doping or ionization potential for n-doping. This is attended by a decreasing chemical stability of the molecules.

Now the object of the invention consists in specifying a solution to overcome the said chemical instability of efficient dope molecules and to specify the production of layers doped therewith.

According to the invention, the object is accomplished by the features named in Claim 1. Advantageous embodiments are the subject of subsidiary claims.

The object is accomplished further by a method having the features described herein. Advantageous modifications of the method are also described herein.

The invention employs organic molecules which, while unstable in the neutral state, yet are present stable as charged cation or anion in connection with a covalent partner. These charged molecules are produced in situ from a predecessor compound, which, during or after the process of vapor deposition, is converted into the desired charged molecule. Without limitation thereto, such a compound may for example be an organic salt or a metal complex. The unstable dopant also can be produced in situ from a stable predecessor substance.

Heretofore, the donor molecule used was introduced into the layer to be doped in the neutral state, being then present as anion or cation on the matrix after a charge transfer. The use of the neutral molecule is here only an intermediate step to bring about the charge transfer. The associated stability problems already described may be avoided according to the invention by use of an already ionized stable molecule as dopant.

If necessary, use is made of further methods to support the dissociation of the predecessor compound. These contribute the necessary energy to split the compound, or bring about a chemical reaction with the unwanted remainder of the predecessor compound, so that it does not arrive in the layer, or is more easily removed therefrom, or does not impair the electrical properties of that layer. An advantageous solution according to the invention is the use, for example, of a laser to evaporate rhodamine B chloride, leading to predominant production of rhodamine B cations.

Even though the foregoing description aims at splitting off an already charged molecular group according to Claim 1, the purpose of the invention may also be achieved if a neutral radical is first produced from the compound according to Claim 1, sufficiently stable in situ to be incorporated in the layer, and this is subject in the layer to a transfer of the radical electron to the matrix, or acceptance of an additional electron from the matrix.

U.S. Pat. No. 5,811,833 describes an electron transport layer consisting of free radicals, in particular pentaphenyl cyclopentadienyl, for use in organic light-emitting diodes. U.S. Pat. No. 5,922,396 shows that such a layer can be prepared from metal-organic compounds, in particular decaphenyl germanocene or decaphenyl plumbocene (see also M. J. Heeg, *J. Organometallic Chem.* 346 (1988), 321). U.S. Pat. No. 5,811,833 and U.S. Pat. No. 5,922,396 lead to layers with enhanced microscopic charge carrier mobility (transfer rates in the hopping process), since a negatively charged pentaphenyl cyclopentadienyl molecule possesses an aromatic character, and so the electron transfer to a neighboring neutral pentaphenyl cyclopentadienyl molecule is improved by the overlap of the pi-electron orbitals of the participating molecules. The enhancement of conductivity is achieved by an enhancement of the microscopic charge carrier mobility (or of the transfer rates in the hopping process). Contrariwise, according to the invention the equilibrium charge carrier density is enhanced, to increase the conductivity. Discrimination is possible for example by "time-of-flight" (measurement of charge carrier mobility), using the Seebeck effect or the field effect (measurement of charge carrier density).

The invention relates further to the use of doping molecules in mixed layers additionally containing materials to accomplish some other purpose. These purposes may for example pertain to alteration of layer growth, production of interpenetrating networks (C. J. Brabec et al., *Adv. Mater.* 11 (2001, no. 1) 15), or, in organic light-emitting diodes, improvement of quantum efficiency of emission or change of color of emitted light by addition of a luminescence dye.

Further, in the spirit of the invention, suitable choice of the doping molecule used can achieve such purposes simply by addition of the doping molecule to the layer. For example, cationic dyes such as rhodamine B often have a high quantum yield of luminescence, making possible their use as luminescence dyes in organic LEDs.

Finally, the invention embraces the use of molecules according to Claim 1 to dope polymer layers. Such layers are typically produced by a "spin coating" process, by deposition from the solution. Contrary to the known electrochemical doping, in which the anions and cations of a salt are drawn to the respective contacts by the applied voltage and therefore are mobile, the present invention, according to Claim 1, allows the doping of polymer layers with large, non-mobile molecules.

An embodiment illustrating the invention by way of example consists in use of the dye molecule rhodamine B chloride as dope. If a mixed layer of naphthalene tetracarboxylic acid dianhydride (NTCDA) and rhodamine B in proportions (150:1) is produced, a conductivity of $1 \times 10^{-5}$ S/cm is obtained at room temperature, corresponding to an increase by 4 orders of magnitude over a pure NTCDA layer. The physical explanation of this is that rhodamine B chloride molecules during heating in the cell decompose into positively charged rhodamine B molecules and negatively charged chloride ions. The charged rhodamine B molecules are incorporated in the mixed layer. The electrons required to maintain charge neutrality of the layer as a whole remain on the NTCDA molecules, since the electronic affinity of NTCDA is higher than that of rhodamine B (3.2 eV, H. Meier, *Organic Semiconductors*, Verlag Chemie Weinheim 1974, p. 425). These electrons fill the lowest unoccupied orbitals of NTCDA and so increase the conductivity. The enhanced density of the charge carriers may for example be established by measurements of the Seebeck coefficient and of the field effect. Field effect measurements on a sample of NTCDA doped with pyronine B (50:1) confirm the presence of electrons as majority charge carriers in a concentration of $10^{17}$ cm$^{-3}$. Seebeck measurements on this system likewise show n-conduction, with a Seebeck coefficient of $-1.1$ mV/K and hence a higher charge carrier concentration than attainable heretofore with doped NTCDA (A. Nollau et al., *J. Appl. Phys.* 87 (2000, no. 9), 4340).

If a layer doped with rhodamine B is prepared from C60 (fullerene) (50:1) with elevated substrate temperature a conductivity of $6 \times 10^{-3}$ S/cm is obtained. This is two orders of magnitude greater than for a specimen produced at room temperature ($5 \times 10^{-5}$ S/cm). The heat supplied during vapor deposition leads to an intensified detachment of rhodamine B.

The doping effect of rhodamine B was also verified for matrices of MePTCDI (perylene 3,4,9,10-tetracarboxylic acid N,N'-dimethyl-diimide) and PTCDA (3,4,9,10-perylene tetracarboxylic acid dianhydride), and so is independent of the concrete chemical structure of the matrix.

A strong known organic donor, tetrathiafulvalene (TTF), has an oxidation potential of +0.35 V against SCE (Y. Misaki et al., *Adv. Mater.* 8 (1996), 804). Stronger donors, i.e. dopes having a lower oxidation potential, are unstable in air (G. C. Papavassiliou, A. Terzis, P. Delhaes, in H. S. Nalwa (ed.), *Handbook of Conductive Molecules and Polymers*, vol. 1, "Charge-transfer salts, fullerenes and photoconductors," John Wiley & Sons, Chichester 1997). Rhodamine B has a reduction potential of $-0.545$ V against NHE (M. S. Chan, J. R. Bolton, *Solar Energy* 24 (1980), 561), i.e. $-0.79$ V against SCE. The reduction potential of the organic salt rhodamine B is determined by the reduction potential of the rhodamine B cation. This value is equal to the oxidation potential of the neutral rhodamine B radical. Consequently the rhodamine B radical is a stronger donor than TTF. But in the chemical compound rhodamine B chloride, this strong donor rhodamine B is stable. So while it has been possible heretofore to employ donors having an oxidation potential greater than +0.35 V against SCE, the invention here described allows doping with donors whose oxidation potential is smaller than +0.35 V against SCE.

Chemically stable compounds in the sense of Claim 1 are for example ionic dyes. These are employed in photography to sensitize AgBr for example. The electronic affinity of AgBr is 3.5 eV. Dyes able to sensitize AgBr by electron transfer are also suitable as chemically stable compounds for use to dope organic semiconductor materials in the spirit of Claim 1.

A subclass of the ionic dyes are the di- and triphenylmethane dyes and their known analogues of general structure

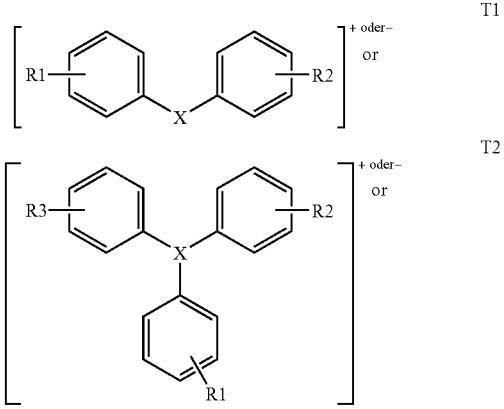

where X CR$^4$, SiR$^4$, GeR$^4$, SnR$^4$, PbR$^4$, N, P and R1, R2, R3 and R$^4$ are suitable known substituents, e.g. in each instance one or several hydrogens; oxygens; halogens, e.g. fluorine, chlorine, bromine or iodine; hydroxyl; aminyl, e.g.

diphenylaminyl, diethylaminyl; aliphatics having 1 to 20 carbon atoms, e.g. methyl, ethyl, carboxyl; alkoxyl, e.g. methoxy; cyano; nitro; sulfonic acid and its salts; aryls having 3 to 25 carbon atoms, e.g. phenyl, pyridyl or naphthyl, or those atoms which form a condensed ring.

Often one or more p-located substitutions of the phenyl groups are encountered (T3 to T6)

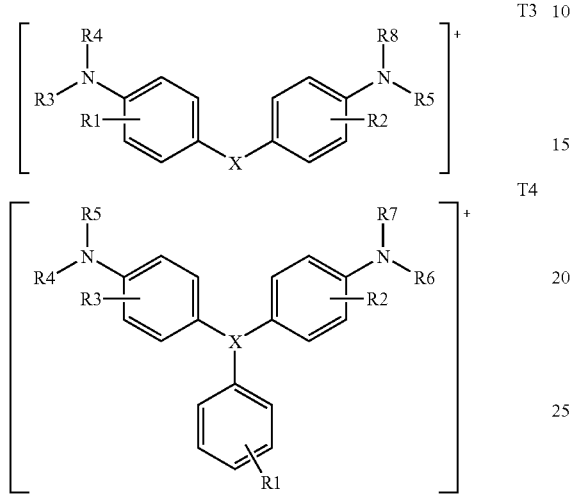

where X CR8, SiR8, GeR8, SnR8, PbR8, N, P and R1 to R7 and R8 are suitable known substituents, e.g. in each instance one or more hydrogens; oxygens; halogens, e.g. fluorine, chlorine, bromine or iodine; hydroxyls; aminyl, e.g. diphenyl aminyl; diethyl aminyl; aliphatics having 1 to 20 carbon atoms, e.g. methyl, ethyl, carboxyl; alkoxyl, e.g. methoxy; cyano; nitro; sulfonic acid and its salts; aryl having 3 to 25 carbon atoms, e.g. phenyl, pyridyl or naphthyl, or those atoms which form a condensed ring.

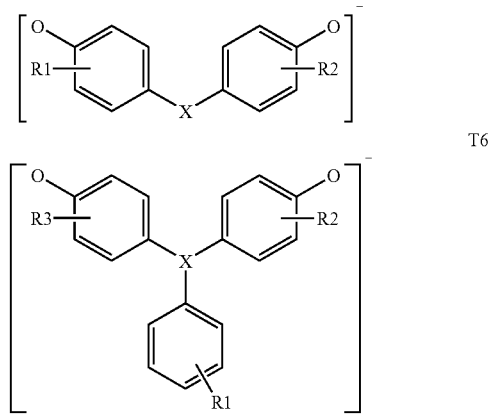

Examples of diphenylmethane dyes are auramine O (CI 655) or auramine G (CI 656).

Examples of triphenylmethane dyes are malachite green (CI 657), turquoise blue (CI 661), fluoresceine (CI 45350) or patent blue V (CI 712).

The triphenylmethane representative malachite green chloride, in an NTCDA matrix at a dope ratio of 1:122 produces a conductivity of $4 \times 10^{-4}$ S/cm. Thus malachite green, is suitable for producing a dopant molecule in situ. This property is evoked by the valence structure of the central carbon atom (4th main group). Other known compounds of this structural type with atoms of the 4th main group as central atom (triarylsilyl, germyl, stannyl, plumbyl) are accordingly likewise suitable as compounds in the sense of the claims. Compounds in which there is a direct bond between 2 carbon atoms each of a phenyl ring of the di- or triphenylamines are described herein.

The doping effect also occurs using the leuko forms (T7, T8) of the ionic dyes. Rhodamine B base acts to dope a PTCDA matrix, e.g. can produce a conductivity of $7 \cdot 10^{-5}$ S/cm for 1:70 doping.

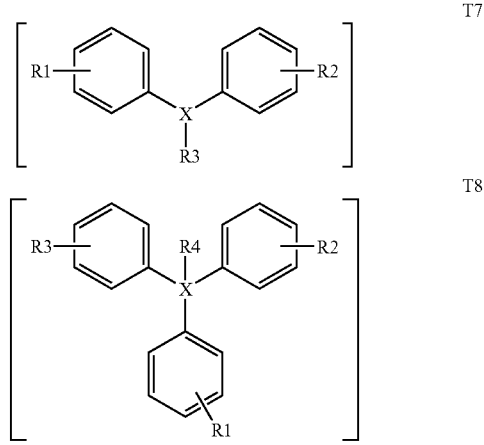

Another group of ionic dyes are the xanthene dyes.

The above-mentioned rhodamine B is a representative of this class. Pyronine B, rhodamine 110 and rhodamine 3B as additional representatives of this class of materials likewise have a doping effect. Similar to the xanthene dyes are among others the pyrane, thiopyrane, indamine, acridine, azine, oxazine and thiazine dyes, which are distinguished by substitutions in the multinuclear heterocycle. On the basis of their otherwise like structure, these dye classes (T9) are likewise suitable compounds in the sense of the claims.

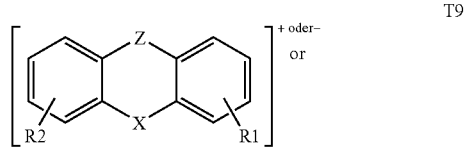

Dyes based on a polymethine structure

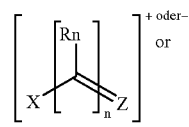

also act as dopes.

N,N'-diethylcyanine and N,N'-diethylthiacarbocyanine in an NTCDA matrix cause an enhancement of conductivity to $3 \cdot 10^{-5}$ S/cm (dope ratio 1:114) and $5 \cdot 10^{-5}$ S/cm (dope ratio 1:47) respectively. These two dyes each represent the polymethine dye with a certain choice of X and Z.

The leuko bases of ionic dyes are likewise suitable compounds in the sense of the claims. For example, rhodamine B base in NTCDA yields a conductivity of $3 \cdot 10^{-5}$ S/cm (1:70 dope ratio).

Since the doping effect does not link to the ionic dye property, but rather to the character of the dyes as organic salts, other organic salts also will act as compound in the sense of the claims. Organic salts are often based on suitable heterocycles (e.g. pyridinium, pyrrolium, pyrylium, thiazolium, diazininium, thininium, diazolium, thiadiazolium or dithiolium etc., singly or as part of a multinuclear heterocycle), or suitable groups (e.g. ammonium, sulfonium, phosphonium, iodonium etc.).

Mass spectrometry studies in the case of pyronine B chloride show that in the evaporation of pyronine B, among other things HCl and a protonized form of pyronine B of mass number 324 is formed. Evidently the chlorine radicals produced by detachment of pyronine B chloride and neutral pyronine B radicals are saturated by a proton. These protons are supplied by other pyronine B molecules in the evaporating substance. A vapor-deposited layer of pyronine B chloride is colorless in the first instance. This is shown by the formation of neutral pyronine B. Under the influence of oxygen, the vapor-deposited layer becomes red in color again, corresponding to the formation of the pyronine B cation, i.e. the evaporated substance is oxidized under the influence of oxygen. This process takes place likewise in a mixed layer of matrix and dope. Vapor-deposited mixed layers of pyronine B chloride and tetracyanoquinodimethane are colored red immediately, and the presence of tetracyanoquinodimethane anion can be evidenced by UV/VIS and FTIR spectroscopy.

The invention claimed is:

1. An electrically doped organic semiconductor material, having an enhanced conductivity as compared to the electrically doped organic semiconductor material without the dopant,
    obtained by doping an organic semiconductor material with a stable, chemical predecessor compound,
    splitting the stable, chemical predecessor compound into at least one organic molecular group A and at least one combining partner B, wherein the at least one molecular group A is a cation, wherein the organic semiconductor material is a host anion, and
    imparting a charge transfer by the cation to the organic semiconductor material,
    wherein the organic molecular group A's oxidation potential is smaller than +0.035V against SCE.

2. The electrically doped organic semiconductor material of claim 1, wherein one of the at least one the combining partners B is from the same molecular group as the organic molecular group A.

3. The electrically doped organic semiconductor material of claim 1, wherein the at least one combining partner B is a molecular group, an atom or an ion.

4. The electrically doped organic semiconductor material of claim 1, wherein the organic molecular group A is a singly or multiply charged cation.

5. The electrically doped organic semiconductor material of claim 1 wherein the organic molecular group A comprises the structure A3 or the corresponding leuko base A4

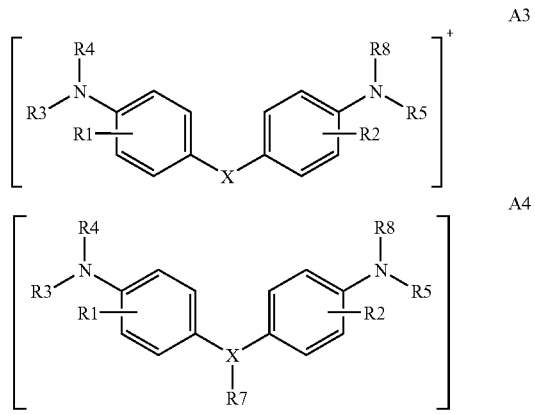

wherein X is selected from the group consisting of CR8, SiR8, GeR8, SnR8, PbR8, N, or P, and R1 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, R2 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, R3 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, R4 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, R5 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, R6 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, R7 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, and R8 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms.

6. An electrically doped organic semiconductor material, having an enhanced conductivity as compared to the electrically doped organic semiconductor material without the dopant,
obtained by doping an organic semiconductor material with a stable, chemical predecessor compound,
splitting the stable, chemical predecessor compound into at least one organic molecular group A and at least one combining partner B, wherein the at least one molecular group A is an anion, wherein the organic semiconductor material is a host cation, and
imparting a charge transfer by the anion to the organic semiconductor material,
wherein the organic molecular group A's oxidation potential is smaller than +0.035V against SCE.

7. The electrically doped organic semiconductor material of claim 6, wherein one of the at least one the combining partners B is from the same molecular group as the organic molecular group A.

8. The electrically doped organic semiconductor material of claim 6, wherein the at least one combining partner B is a molecular group, an atom or an ion.

9. The electrically doped organic semiconductor material of claim 6, wherein the organic molecular group A is a singly or multiply charged anion.

10. The electrically doped organic semiconductor material of claim 6 wherein the organic molecular group A comprises the structure A3 or the corresponding leuko base A4

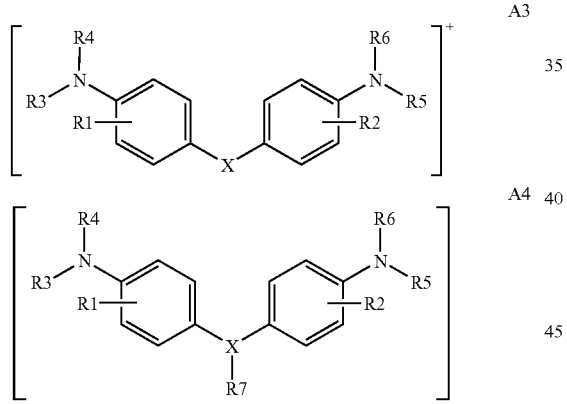

wherein X is selected from the group consisting of CR8, SiR8, GeR8, SnR8, PbR8, N, or P, and
R1 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms,
R2 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms,
R3 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms,
R4 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms,
R5 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms,
R6 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms,
R7 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms, and
R8 is selected from the group consisting of a hydrogen, an oxygen, a halogen, a hydroxyl, an aminyl, an aliphatic having 1 to 20 carbon atoms, an alkoxyl, a cyano, a nitro, a sulfonic acid or any of its salts, or an aryl having 3 to 25 carbon atoms.

11. An electrically doped organic semiconductor material including an organic semiconductor material doped with a dopant, the dopant comprising an organic molecular group of a chemical predecessor compound, the chemical predecessor compound comprising the organic molecular group and a combining partner, the organic molecular group being split from the predecessor compound, the electrically doped organic semiconductor material having enhanced conductivity compared to the organic semiconductor material without the dopant,
wherein the organic molecular group imparts a charge transfer to the organic semiconductor material,
wherein the organic molecular group is a cation,
wherein the organic semiconductor material is a host anion, and
wherein the organic molecular group has an oxidation potential smaller than +0.035 V against SCE.

12. The electrically doped organic semiconductor material of claim 11, wherein the combining partner is from the same molecular group as the organic molecular group.

13. The electrically doped organic semiconductor material of claim 11, wherein the combining partner is a molecular group, an atom or an ion.

14. The electrically doped organic semiconductor material of claim 11, wherein the organic molecular group is a singly or multiply charged cation.

15. The electrically doped organic semiconductor material of claim 11, wherein the chemical predecessor compound comprises more than one organic molecular group, each organic molecular group having at least one combining partner.

16. An electrically doped organic semiconductor material including an organic semiconductor material doped with a dopant, the dopant comprising an organic molecular group of a chemical predecessor compound, the chemical predecessor compound comprising the organic molecular group and a combining partner, the organic molecular group being split from the predecessor compound, the electrically doped organic semiconductor material having enhanced conductivity compared to the organic semiconductor material without the dopant, wherein the organic molecular group imparts a charge transfer to the organic semiconductor material, wherein the organic molecular group is a anion, wherein the organic semiconductor material is a host cation, and wherein the organic molecular group has an oxidation potential smaller than +0.035V against SCE.

17. The electrically doped organic semiconductor material of claim 16, wherein the combining partner is from the same molecular group as the organic molecular group.

18. The doped electrically organic semiconductor material of claim 16, the combining partner is a molecular group, an atom or an ion.

19. The electrically doped organic semiconductor material of claim 16, wherein the organic molecular group is a singly or multiply charged anion.

20. The electrically doped organic semiconductor material of claim 16, wherein the chemical predecessor compound comprises more than one organic molecular group, each organic molecular group having at least one combining partner.

* * * * *